United States Patent [19]

Böhme

[11] Patent Number: 5,473,529
[45] Date of Patent: Dec. 5, 1995

[54] CIRCUIT ARRANGEMENT FOR RECTIFYING AN AC VOLTAGE SIGNAL WITH A PLURALITY OF DIFFERENTIAL AMPLIFIER STAGES

[75] Inventor: Rolf Böhme, Bad Friedrichshall, Germany

[73] Assignee: Temic Telefunken microelectronic GmbH, Heilbronn, Germany

[21] Appl. No.: 230,151

[22] Filed: Apr. 19, 1994

[30] Foreign Application Priority Data

May 13, 1993 [DE] Germany .................. 43 16 027.1

[51] Int. Cl.⁶ .................. H02M 7/217; H03F 3/04
[52] U.S. Cl. .................. 363/127; 330/301
[58] Field of Search .................. 363/125, 127; 307/260, 261, 494, 496, 500; 330/263, 275, 301; 328/26

[56] References Cited

U.S. PATENT DOCUMENTS

| | | | |
|---|---|---|---|
| 4,575,643 | 3/1986 | Sakai | 328/26 |
| 4,685,048 | 8/1987 | Tazaki | 363/127 |
| 4,941,080 | 7/1990 | Sieborger | 363/127 |
| 5,122,760 | 6/1992 | Nishijima | 307/261 |
| 5,203,019 | 4/1993 | Rinderle | 455/67.3 |

FOREIGN PATENT DOCUMENTS

| | | | |
|---|---|---|---|
| 0233443 | 8/1987 | European Pat. Off. | 363/127 |
| 2606486 | 8/1976 | Germany | 363/127 |
| 2527658 | 12/1976 | Germany | 363/127 |
| 3238302 | 5/1983 | Germany | 363/127 |
| 3641321 | 6/1987 | Germany | 363/127 |
| 255003 | 3/1988 | Germany | 363/127 |
| 267807 | 5/1989 | Germany | 363/127 |
| 1312492 | 5/1987 | U.S.S.R. | 363/127 |

OTHER PUBLICATIONS

U. Tietze et al.: "Halbleiter–Schaltungstechnik" (Semiconductor circuitry), Springer–Verlag 1978, 4th edition, FIG. 25.13.
C. Toumazou et al.: "Analogue IC design: the current–mode approach", London 1990, FIG. 2.10.
N. N.: Transistor Full–Wave Rectifier Circuits. In Electronics & Wirless World, Jun. 1986, p. 29.
N. N.: Präzisions–Gleichrichter mit 5–V–Betriebsspannung. In: Elektor, Jul./Aug. 1987, p. 37.

*Primary Examiner*—Peter S. Wong
*Assistant Examiner*—Matthew V. Nguyen
*Attorney, Agent, or Firm*—Spencer, Frank & Schneider

[57] ABSTRACT

In accordance with the present invention, two unsymmetrical differential amplifier stages are fed from a common signal source that supplies an AC voltage signal, but to which the two differential amplifier stages are connected with respect to the unsymmetry in opposite senses. The outputs of the two differential amplifier stages, however, are connected with respect to the unsymmetry in like sense and to an output circuit that provides the load resistances and whose output supplies the rectified a.c. voltage signal that also has an approximately quadratic characteristic.

18 Claims, 5 Drawing Sheets

CIRCUIT ARRANGEMENT FOR RECTIFYING AN AC VOLTAGE SIGNAL WITH A PLURALITY OF DIFFERENTIAL AMPLIFIER STAGES

BACKGROUND OF THE INVENTION

1. Field of the Invention

The invention relates to a circuit arrangement for rectifying an AC voltage signal generated by a signal source where the circuit has a differential amplifier including at least a first and a second transistor and where the a.c. voltage signal is supplied to inputs of both transistors.

2. Background of the Invention

A circuit arrangement of this kind is known from "Halbleiterschaltungstechnik" ("Semiconductor circuitry") by U. Tietze and Ch. Schenk, Springer-Verlag 1978, 4th edition, FIG. 25.13. In this, the AC voltage signal is fed to a transistor in the differential amplifier stage while the base electrode of the second transistor is at a reference potential. The collector potentials of these two differential amplifier transistors are fed to two emitter followers connected in parallel so that the positive collector potential is transferred in each case to the output.

Another circuit for the rectification of AC voltage signals is known from "Analog IC design: the current-mode approach" by C. Tamazou, F. J. Lidgey and D. G. Haigh, published by Peter Peregrinus Ltd, London 1990, FIG. 2.10, in which the rectified signal has an approximately quadratic characteristic. This circuit is shown in FIG. 5 and includes three npn transistors T7, T8 and T9. The emitter surface area of the middle transistor T8 is n times greater than the equivalent surface areas of the other two transistors T7 and T8. The emitter electrodes of these three transistors are fed from a single constant current source that supplies a current I1. A resistor R7 is connected between the bases of transistors T7 and T8 and another resistor R8 with identical resistance value is connected between the bases of transistors T8 and T9. Consequently, an a.c. voltage signal Ue supplied from a signal source 4 is fed directly to the base electrode of transistor T7, but only one-half of this signal is fed to transistor T8. Finally, the collector electrodes of transistors T7 and T9 are connected directly to an operating voltage source UB whereas that of the middle transistor T8 is connected to this operating voltage source via a load resistance R9. The function of this circuit will now be explained below with reference to the Ue - Ic diagram as shown in FIG. 6. With a surface area ratio n between the transistors T8 and T7 and also between T8 and T9, in the quiescent state a collector current Ic8 of transistor T8 flows with a magnitude of $I1 \cdot n/(n+2)$ through the load resistor R9. In the diagram shown in FIG. 6, this is the intersection of the curve Ic8 with the ordinate axis.

With an input voltage Ue≠0, however, the transistor T7 or T9 takes an increasingly large proportion of the current as curves Ic7 and Ic8 in FIG. 6 show. At the same time, current Ic8 reduces and its curve in the region of zero of the input voltage Ue (see region d in FIG. 6) approximates a parabola of the second degree. Consequently the voltage at the collector of transistor T8 rises above the quiescent state value. This corresponds to a rectification of the a.c. voltage signal Ue with quadratic characteristic.

In this known circuit in accordance with FIG. 5, however, the power consumption in the two resistors R7 and R8 is disadvantageous. Moreover, for this circuit to operate reliably, a high input voltage Ue is required.

SUMMARY OF THE INVENTION

The object of the invention is to specify a circuit arrangement of the type described at the outset that can be operated reliably with a low supply voltage and also draws only a small amount of current.

In a circuit arrangement for rectifying an a.c. voltage signal generated by a signal source, where the circuit has a differential amplifier stage comprising at least a first transistor and a second transistor and where the a.c. voltage signal is supplied to both their inputs, this object is accomplished by providing a second differential amplifier stage and with both stages being of unsymmetrical or symmetrical design, but made functionally unsymmetrical by means of a suitable offset voltage. These two differential amplifier stages are connected to the signal source in opposite senses with respect to their unsymmetry, whereas the outputs are connected in the same sense with respect to the unsymmetry. The outputs are connected to an output circuit that supplies the rectified a.c. voltage signal.

This circuit arrangement in accordance with the present invention has the advantage compared with the one shown in FIG. 5 that, for otherwise identical characteristic curves, only half the input voltage Ue is required for reliable operation because there is no voltage divider on the input side. Moreover, this circuit in accordance with the present invention operates much faster than conventional bridge circuits made with rectifier diodes.

A further advantage is provided by the output characteristic of the circuit arrangement in accordance with the present invention that has an approximately quadratic form in the region of the zero point because this represents a variable that is proportional to the power.

In an advantageous development of the circuit arrangement in accordance with the present invention, the unsymmetry of the two differential amplifier stages is created by an area or width ratio of the associated transistors.

In another advantageous development of the circuit arrangement in accordance with the present invention, this unsymmetry of the two differential amplifier stages can also be created by an auxiliary voltage that overlays the a.c. voltage signal which is to be rectified. Thus the differential amplifier stages are made unsymmetrical by external offset voltages instead of the surface area ratio of the emitters, where in accordance with an advantageous development of the present invention these offset voltages are created at pick-offs on load resistors in a differential amplifier stage on the input side. In another embodiment of the invention, the unsymmetry is created by one-sided emitter resistors as shown in FIG. 7 by resistors R9 and R10. The use of such symmetrically designed differential amplifier stages offers the advantage that transistors which are identical to one another can be used.

Furthermore, the circuit in accordance with the present invention can be developed further in such a way that the output circuit contains two ohmic load resistors each of which is connected with an output of the differential amplifier stages. So that the resulting output signal here assumes the value zero in the quiescent state of the circuit arrangement, the conductance values of these two load resistors can be designed to be proportional to the value that corresponds to the unsymmetry of the differential amplifier stages.

Furthermore, the two outputs can also be connected via a current balancing circuit, where in accordance with a further embodiment of the present invention the balancing factor is set in accordance with the value forming the unsymmetry in the differential amplifier stages so that here too the quiescent current assumes the value zero. At the same time, one obtains in an advantageous manner an addition of the quadratic components of the output current.

BRIEF DESCRIPTION OF THE DRAWINGS

The invention will now be described and explained below on the basis of embodiment examples together with the drawings. The drawings show.

DESCRIPTION OF THE PREFERRED EMBODIMENTS

Figure 1:
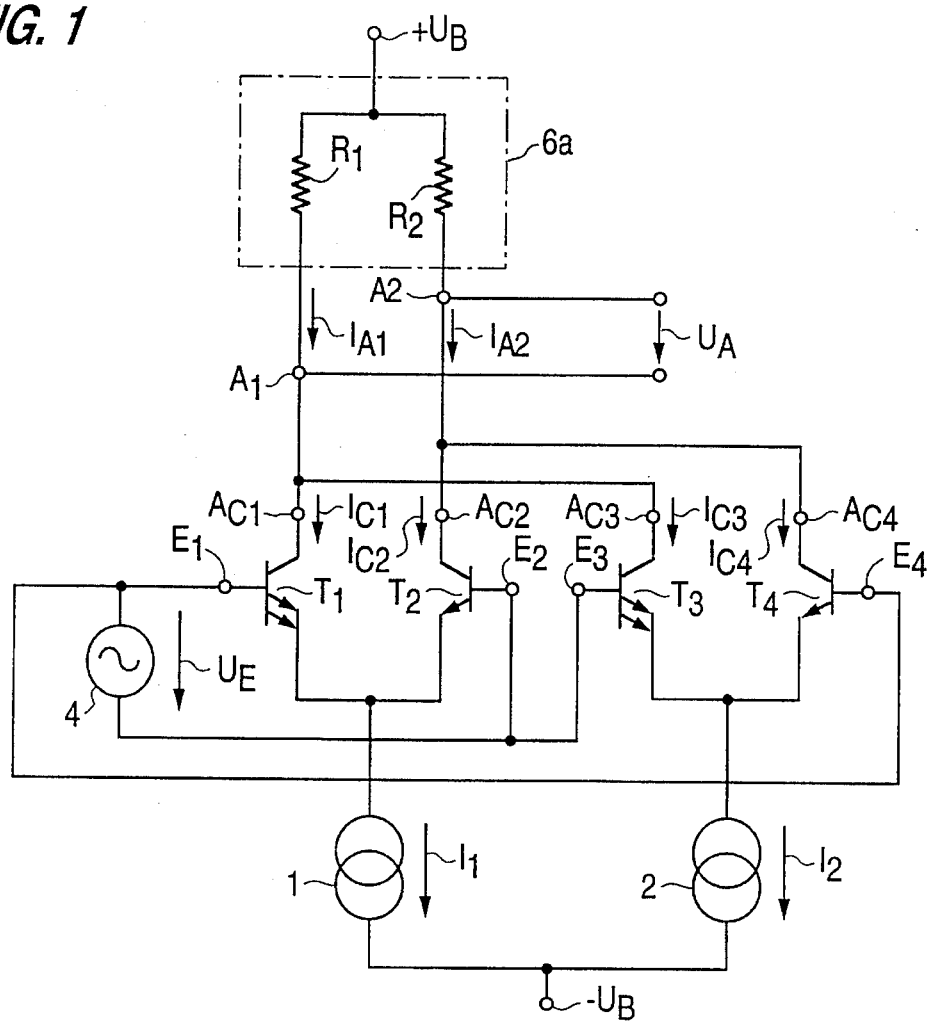
FIG. 1 is a circuit arrangement as embodiment example of the invention.

The circuit arrangement in FIG. 1 shows two differential amplifier stages made up from npn transistors T1 and T2 as well as T3 and T4. A signal source 4 generates an a.c. voltage signal Ue as an input voltage which is supplied to both differential amplifier stages at the same time. In the two differential amplifier stages, one transistor T1 and T3, respectively, has an emitter surface area that is n times greater than that of the partner transistor T2 and T4, respectively, and this is indicated in the Figure by double emitter arrows. The differential amplifier stage T1/T2 has two inputs E1 and E2 each being connected to one terminal of signal source 4. The two inputs E3 and E4 of the second differential amplifier stage T3/T4, however, are not connected in the same sense to the signal source 4 with respect to the unsymmetry in comparison with the first differential amplifier stage T1/T2. The input E3 of the larger transistor T3 is therefore not connected to the same terminal of signal source 4 as the corresponding larger transistor T1 in the differential amplifier stage T1/T2, but to the terminal to which the input E2 of the smaller transistor T2 is connected. Equally, input E4 of the smaller transistor T4 in the second differential amplifier stage T3/T4 is connected to the same terminal of signal source 4 as input E1 of the larger transistor T1 in the first differential amplifier stage T1/T2.

The collector terminals Ac1 and Ac2 as well as Ac3 and Ac4 in the two differential amplifier stages are, however, connected in the same sense with respect to the unsymmetry, i.e., the collector terminal Ac1 of the larger transistor T1 in the first differential amplifier stage T1/T2 is connected to the same point as the collector terminal Ac3 of the larger transistor T3 in the second differential amplifier stage T3/T4, this point representing output A1, and similarly collector terminals Ac2 and Ac4 of the corresponding smaller transistors T2 and T4 are connected together to a second output A2.

At these two outputs A1 and A2, an output circuit 6a with a first and second ohmic load resistors R1 and R2 are each connected on one side to the first and second output A1 and A2 and on the other side to the potential of the positive operating voltage UB.

An output voltage UA, representing the difference between the two connected collector potentials in the circuit, can be picked off at the two outputs A1 and A2.

Finally, each of the two differential amplifier stages T1/T2 and T3/T4 is suppl led from a constant current source 1 and 2 respectively to which in turn the potential of the negative operating voltage UB is applied. Consequently, a constant current I1 flows into the first differential amplifier stage T1/T2 and a constant current I2 into the second differential amplifier stage T3/T4.

Figure 4A:
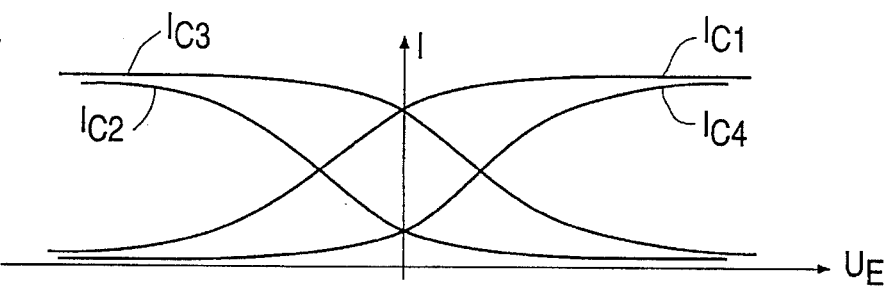
FIG. 4 is current/voltage characteristic curves to explain the function of the embodiment examples.
Figure 4B:
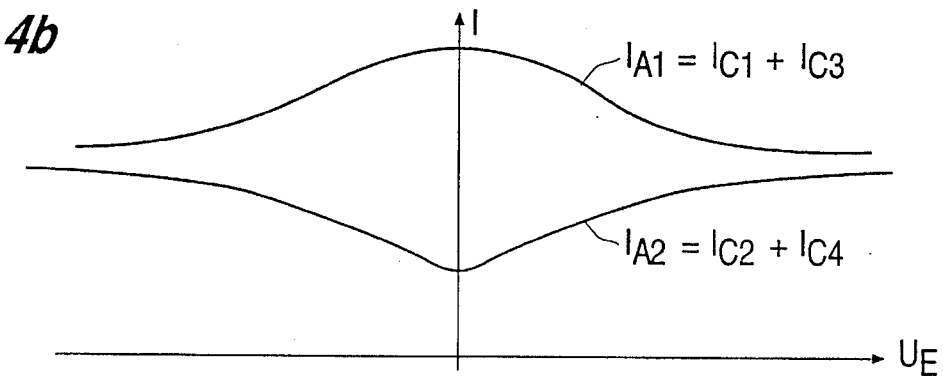
Figure 4C:
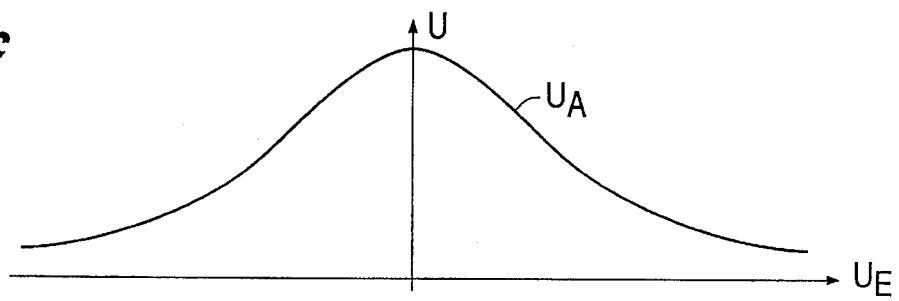

The functioning of the circuit in accordance with the present invention and depicted in FIG. 1 will now be explained in conjunction with the Ue - Ic characteristic curves as shown in FIGS. 4a to 4c. In the quiescent state, that, is with an a.c. voltage signal of Ue=0, the incoming current I1 and I2 respectively splits up in accordance with the surface area ratio n. A current Ic1 from the first differential amplifier stage T1/T2 and a current Ic3 from the second differential amplifier stage T3/T4 with the value $$I_{C1} + I_{C3} = \frac{n}{(n+1)} (I_1 + I_2)$$

thus flows to output A1. However, the current flowing to output A2 is the sum of the two collector currents Ic2 and Ic4 of the respective smaller partner transistors T2 and T4 with the value $$I_{C2} + I_{C4} = \frac{1}{(n+1)} (I_1 + I_2)$$

The corresponding values at Ue=0 are also shown in FIGS. 4a and 4b.

If the ratio of the conductance values of the two resistors R1 and R2 is chosen to correspond to the surface area ratio n of the transistors in the two differential amplifier stages, then a quiescent current with value zero settles in at output UA.

With positive modulation, the collector current Ic1 in the first differential amplifier stage T1/T2 continues to build up and the collector current Ic2 of the partner transistor T2 reduces further, whereas the collector current Ic3 of the larger transistor T3 in the second differential amplifier stage T3/T4 reduces on account of the connection in opposite sense to the signal source 4 and at the same time the collector current Ic4 of partner transistor T4 increases. The relevant characteristics are shown in FIG. 4a. The variation of the total currents IA1 and IA2 fed to outputs A1 and A2 can be seen in FIG. 4b. The two outputs A1 and A2 thus each supply a rectified a.c. voltage signal which has an approximately quadratic form in the region of Ue=0. The output voltage UA represents the difference between the electrical potential at the two outputs A1 and A2 and is shown in FIG. 4c; in the region of Ue=0 the approximately parabolic variation is retained.

The circuit arrangement given in FIG. 1 has a special feature in that, when the modulation is very high, the output currents IA1 and IA2 tend towards the same value irrespective of the polarity of the input voltage Ue, as shown in the diagram of FIG. 4b.

Figure 2:
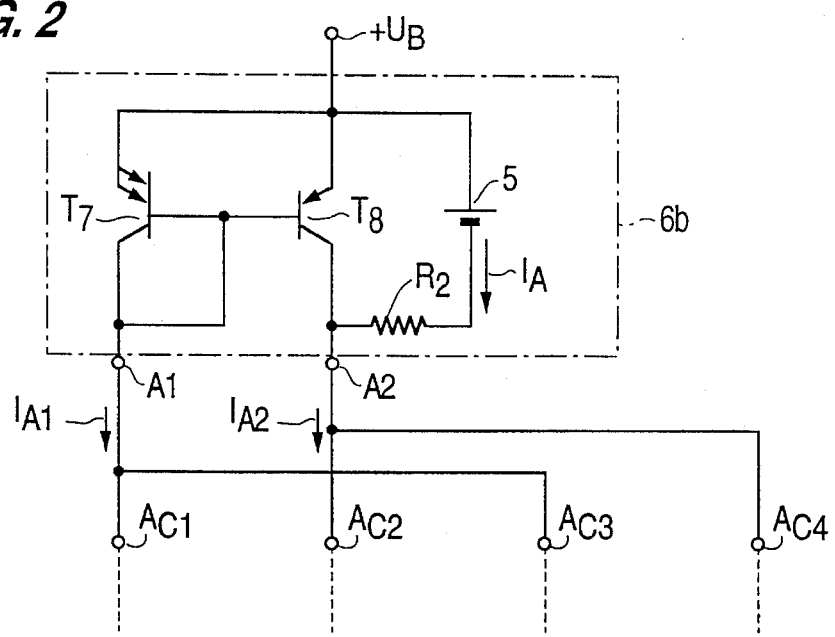
FIG. 2 is an alternative output circuit for the embodiment example shown in FIG. 1.
Figure 4D:
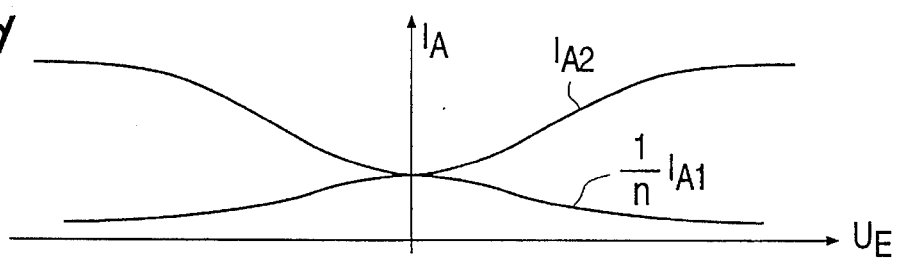
Figure 4E:
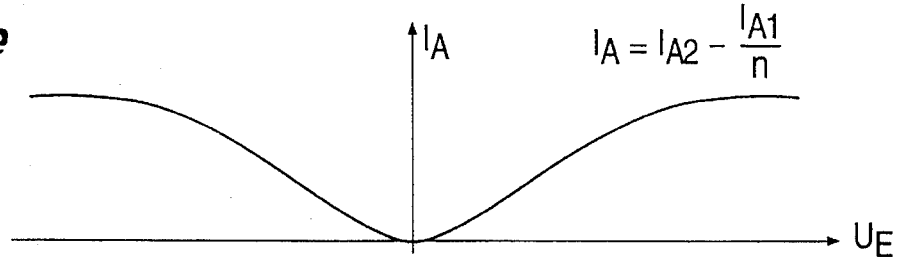
Figure 5:
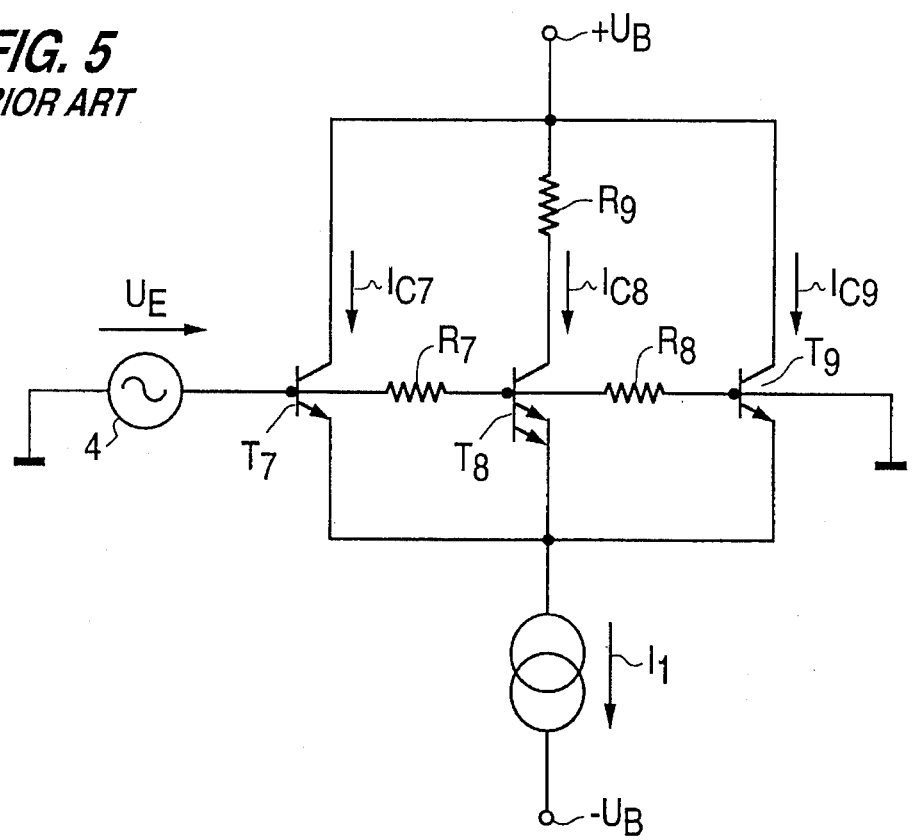
FIGS. 5 and 6, referred to above, illustrate the state of the art.
Figure 6:
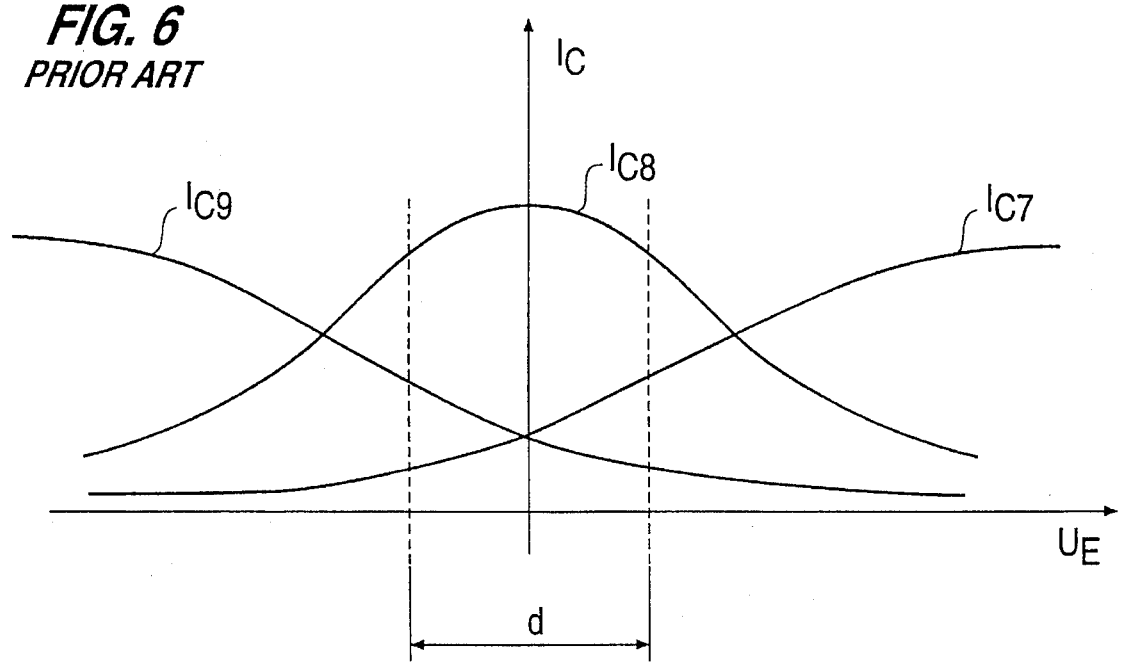
Figure 7:
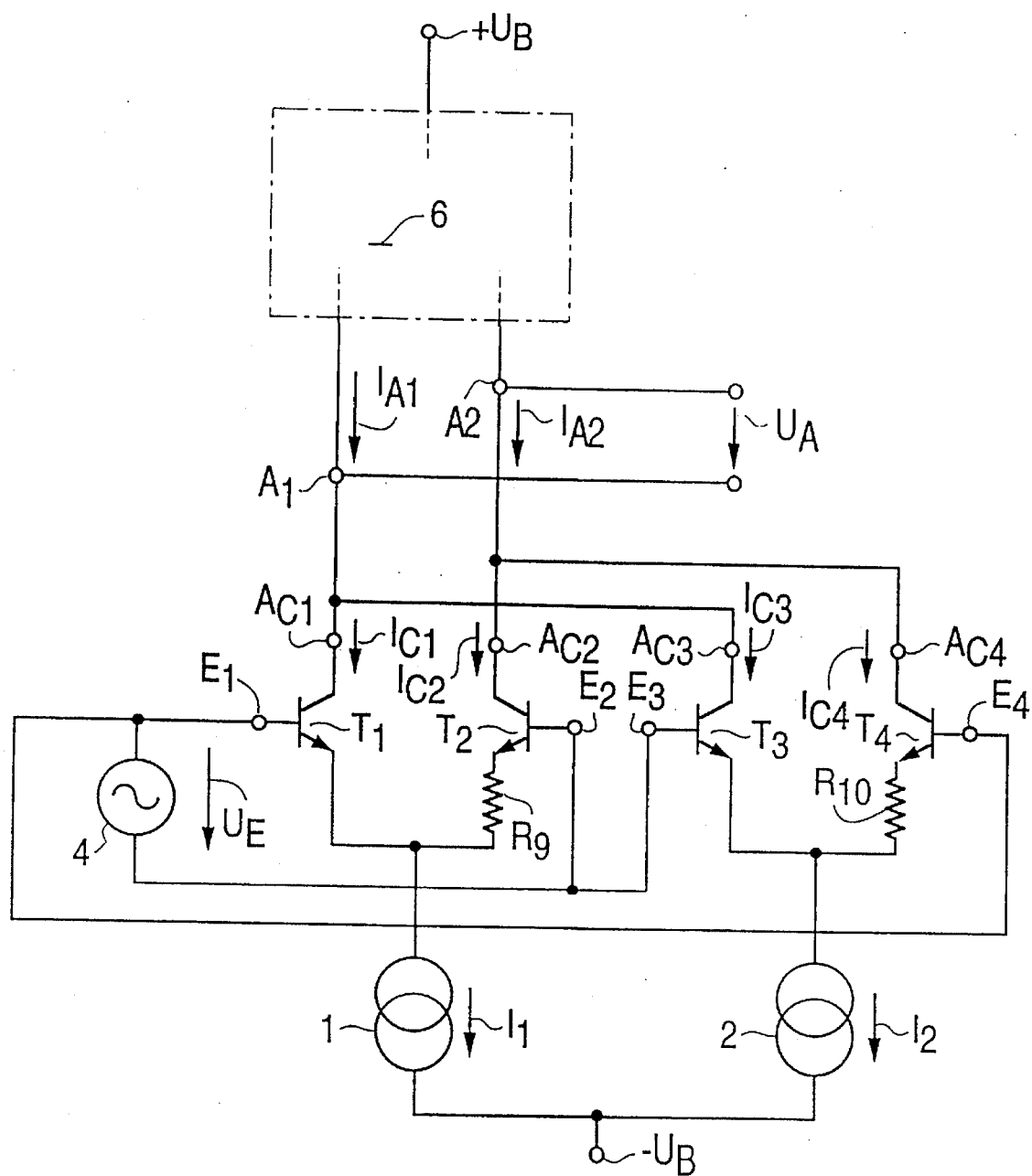
FIG. 7 is a circuit arrangement of the present invention using one-sided emitter resistors to create an unsymmetry.

The circuit arrangement shown in FIG. 2 is an alternative output circuit 6b, but otherwise connected up in the same way as in FIG. 1. The output circuit 6b includes a current balancing arrangement with two pnp transistors T7 and T8 and the equivalent circuit of a sequence stage comprising a d.c. voltage source 5 and an output resistor Ra. Transistor T7, which acts as a diode, is connected to the first output A1 and the associated current source transistor T8 is connected to the second output A2. In addition, the series circuit consisting of d.c. voltage source 5 and output resistor Ra bridges the emitter-collector section of the current source transistor T8 in the current balancing circuit. Finally, the emitter electrodes of the transistors T7 and T8 making up the current balancing circuit are connected to the positive potential of operating voltage source UB. In this current balancing circuit, the balancing value corresponds to the surface area ratio n in differential amplifier stage T1/T2 and T3/T4, respectively, which results in the quiescent current being compensated to value zero, i.e., with an input voltage Ue=0, an output current IA with value zero flows through the output resistor Ra. The corresponding current variation diagrams are given in FIGS. 4d and 4e. The output current IA also, as shown in FIG. 4e, has an approximately parabolic form in the region of the input voltage with value Ue=0, the quadratic components of the two output currents IA1 and IA2 being added together.

Figure 3:
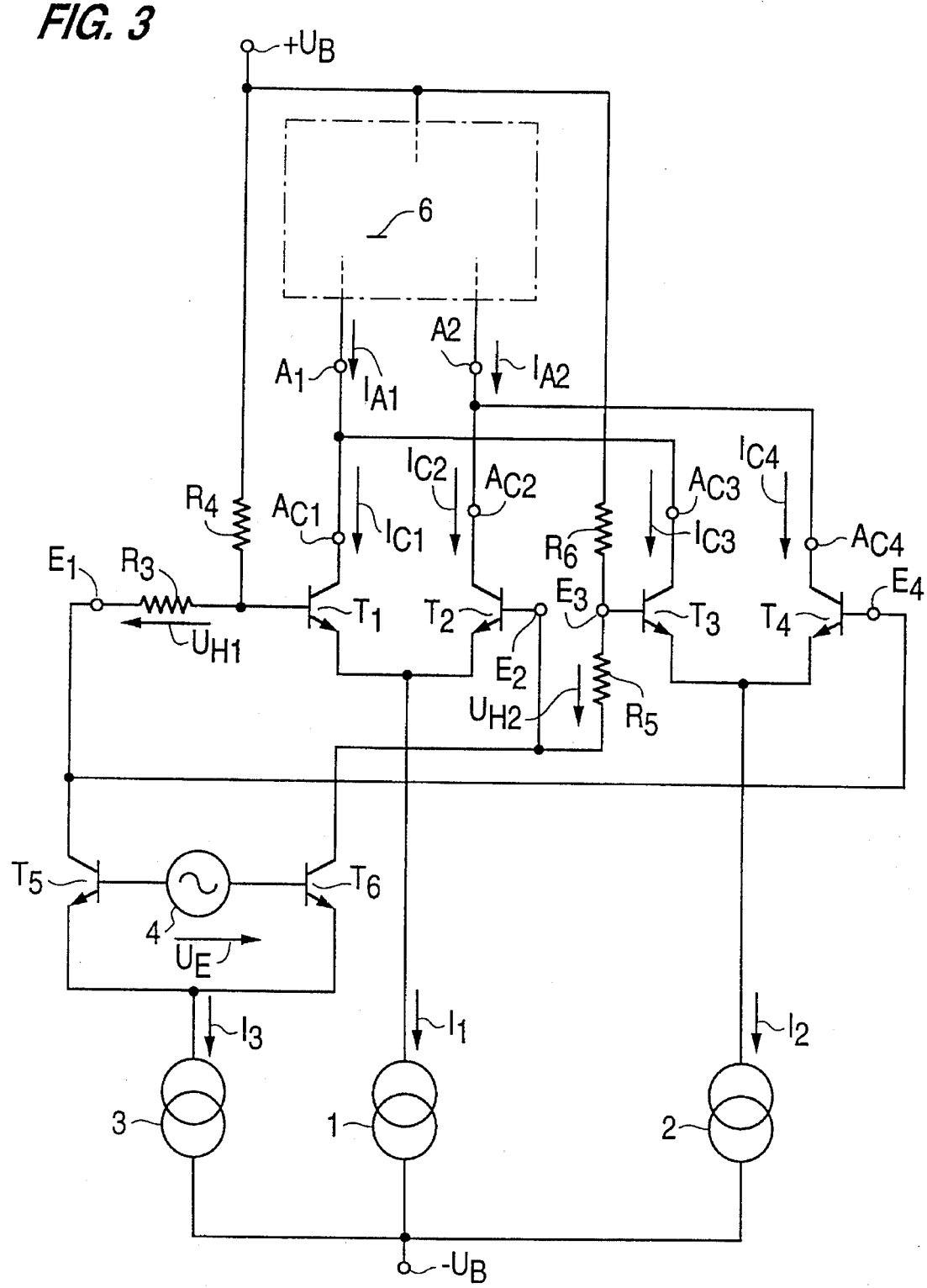
FIG. 3 is a circuit arrangement of a further embodiment example of the invention.

FIG. 3 shows an embodiment of the invention in which the two differential amplifier stages T1/T2 and T3/T4 are each made up of identical transistors. The unsymmetry in these two differential amplifier stages is achieved by means of an auxiliary voltage UH1 and UH2 respectively which is provided by means of a voltage divider R3/R4 and R5/R6, respectively. These two voltage dividers each represent load resistors from a third differential amplifier stage made up of npn transistors T5 and T6. Here, the signal source 4 is connected directly to the two bases of transistors T5 and T6 and their emitter electrodes are fed from a third constant current source 3. Either output circuit 6a in accordance with FIG. 1 or output circuit 6b in accordance with FIG. 2 can be used as output circuit 6.

The embodiment examples of the invention as shown in FIGS. 1 to 3 can also be made up of bipolar transistors of the opposite type of conductivity.

Instead of using differential amplifier stages of the simple design shown by the embodiment examples in the Figures, it is also possible to use differential amplifier stages of complex design such as Darlington differential amplifier stages, complementary differential amplifier stages or Darlington/complementary differential amplifier stages.

What is claimed is:

1. A circuit arrangement for rectification of an a.c. voltage signal generated by a signal source, the circuit arrangement having a first differential amplifier stage comprising at least a first transistor, a second transistor and an output, the first and second transistors each having an input, the signal source being connected to the respective inputs of the first and second transistors for supplying the a.c. voltage signal to the first differential amplifier stage, wherein the improvement comprises:

a) a second differential amplifier stage having a third transistor, a fourth transistor and an output, the third and fourth transistors each having an input;

b) the first and second differential amplifier stages being supplied with a substantially constant current, the respective substantially constant currents supplying the first and second differential amplifier stages being identical;

c) a quiescent current of the first transistor being greater than a quiescent current of the second transistor based on a surface area ratio of the first and second transistors, and a quiescent current of the third transistor being greater than a quiescent current of the fourth transistor based on a surface area ratio of the third and fourth transistors;

d) the respective inputs of the third and fourth transistors of the second differential amplifier stage being connected in an opposite sense to the signal source when compared with the respective inputs of the first and second transistors of the first differential amplifier stage;

e) an output of the circuit arrangement being between the respective outputs of the first and second differential amplifier stages; and f) an output circuit coupled to the respective outputs of the first and second differential amplifier stages for generating a rectified a.c. voltage signal.

2. A circuit arrangement in accordance with claim 1, wherein the output circuit has two ohmic load resistors, each of which is connected to a respective output of the first and second differential amplifiers.

3. A circuit arrangement in accordance with claim 2, wherein conductance values of the two load resistors have a ratio which is the same as the surface area ratio of the transistors of the first and second differential amplifier stages.

4. A circuit arrangement in accordance with claim 1, wherein the output circuit includes a current balancing circuit and wherein the respective outputs of the first and second differential amplifiers are connected to the current balancing circuit.

5. A circuit arrangement in accordance with claim 4, wherein the current balancing circuit has a balancing factor corresponding to the surface area ratio of the respective transistors of the first and second the differential amplifier stages.

6. A circuit arrangement for rectification of an a.c. voltage signal generated by a signal source, the circuit arrangement including a first differential amplifier stage having at least a first transistor, a second transistor and an output, the first and second transistors each having an input, the a.c. voltage signal being coupled between the respective inputs of the first and second transistors, wherein the improvement comprises:

a) a second differential amplifier stage having a third transistor, a fourth transistor and an output, the third and fourth transistors each having an input;

b) the first and second differential amplifier stages each being supplied from a substantially constant current, the respective substantially constant currents supplying the first and second amplifier stages being identical;

c) the first and second transistors being identical transistors, a quiescent current of the first transistor being greater than a quiescent current of the second transistor based on a first predetermined offset voltage which overlays the a.c. voltage signal generated by the signal source and which is applied to the input of the first transistor, and the third and fourth transistors being identical transistors, a quiescent current of the third transistor being greater than a quiescent current of the fourth transistor based on a second predetermined offset voltage which overlays the a.c. voltage signal generated by the signal source and which is applied to the input of the third transistor;

d) the respective inputs of the third and fourth transistors of the second differential amplifier stage being connected in an opposite sense to the signal source when compared with the respective inputs of the first and second transistors of the first differential amplifier stage;

e) an output of the circuit arrangement being between the respective outputs of the first and second differential amplifier stages; and f) an output circuit coupled to the respective outputs of the first and second differential amplifier stages for generating a rectified a.c. voltage signal.

7. A circuit arrangement in accordance with claim 6, further comprising a third differential amplifier stage with a fifth and a sixth transistor, the fifth and sixth transistors being driven by the signal source, and wherein the first and second predetermined offset voltages are generated by first and second voltage dividers, respectively, connected to the third differential amplifier stage.

8. A circuit arrangement in accordance with claim 6, wherein a difference in the quiescent currents of the first and second transistors is based on a first emitter resistor connected to one of the first and second transistors, and a difference in the quiescent currents of the third and fourth transistors is based on a second emitter resistor connected to one of the third and fourth transistors.

9. A circuit arrangement in accordance with claim 6, wherein the output circuit has two ohmic load resistors each of which is connected to the respective outputs of the first and second differential amplifier stages.

10. A circuit arrangement in accordance with claim 9, wherein conductance values of the two load resistors have the same ratio as a ratio of the quiescent currents of the transistors of the first and second differential amplifier stages.

11. A circuit arrangement in accordance with claim 6, wherein the output circuit includes a current balancing circuit and wherein the respective outputs of the first and second differential amplifier stages are connected to the current balancing circuit.

12. A circuit arrangement in accordance with claim 11, wherein the current balancing circuit has a balancing factor corresponding to a ratio of the quiescent currents of the transistors of the first and second differential amplifier stages.

13. A circuit arrangement for rectification of an a.c. voltage signal generated by a signal source, the circuit arrangement having a first differential amplifier stage comprising at least a first transistor, a second transistor and an output, the first and second transistors each having an input, the signal source being connected to the respective inputs of the first and second transistors for supplying the a.c. voltage signal to the first differential amplifier stage, wherein the improvement comprises:

a) a second differential amplifier stage having a third transistor, a fourth transistor and an output, the third and fourth transistors each having an input;

b) the first and second differential amplifier stages being supplied with a substantially constant current, the respective substantially constant currents supplying the first and second differential amplifier stages being identical;

c) a quiescent current of the first transistor being greater than a quiescent current of the second transistor, and a quiescent current of the third transistor being greater than a quiescent current of the fourth transistor;

d) the respective inputs of the third and fourth transistors of the second differential amplifier stage being connected in an opposite sense to the signal source when compared with the respective inputs of the first and second transistors of the first differential amplifier stage;

e) an output of the circuit arrangement being between the respective outputs of the first and second differential amplifier stages; and f) an output circuit having two ohmic resistors, conductance values of the two load resistors having a same ratio as a ratio of the quiescent currents supplying the respective differential amplifier stages, and each of the resistors being connected to a respective output of the first and second differential amplifier stages for generating a rectified a.c. voltage signal.

14. A circuit arrangement for rectification of an a.c. voltage signal generated by a signal source, the circuit arrangement having a first differential amplifier stage comprising at least a first transistor, a second transistor and an output, the first and second transistors each having an input, the signal source being connected to the respective inputs of the first and second transistors for supplying the a.c. voltage signal to the first differential amplifier stage, wherein the improvement comprises:

a) a second differential amplifier stage having a third transistor, a fourth transistor and an output, the third and fourth transistors each having an input;

b) the first and second differential amplifier stages being supplied with a substantially constant current, the respective substantially constant currents supplying the first and second differential amplifier stages being identical;

c) a quiescent current of the first transistor being greater than a quiescent current of the second transistor, and a quiescent current of the third transistor being greater than a quiescent current of the fourth transistor;

d) the respective inputs of the third and fourth transistors of the second differential amplifier stage being connected in an opposite sense to the signal source when compared with the respective inputs of the first and second transistors of the first differential amplifier stage;

e) an output of the circuit arrangement being between the respective outputs of the first and second differential amplifier stages; and f) an output circuit including a current balancing circuit, the current balancing circuit connected to the respective outputs of the first and second differential amplifier stages for generating a rectified a.c. voltage signal.

15. A circuit arrangement in accordance with claim 14, wherein the current balancing circuit has a balancing factor corresponding to a ratio of the quiescent currents supplying the respective differential amplifier stages.

16. A circuit arrangement for rectification of an a.c. voltage signal generated by a signal source, the circuit arrangement including a first differential amplifier stage having at least a first transistor, a second transistor and an output, the first and second transistors each having an input, the a.c. voltage signal being coupled between the respective inputs of the first and second transistors, wherein the improvement comprises:

a) a second differential amplifier stage having a third transistor, a fourth transistor and an output, the third and fourth transistors each having an input;

b) the first and second differential amplifier stages each being supplied from a substantially constant current, the respective substantially constant currents supplying the first and second amplifier stages being identical;

c) the first and second transistors being identical transistors, a quiescent current of the first transistor being greater than a quiescent current of the second transistor, and the third and fourth transistors being identical transistors, and a quiescent current of the third transistor being greater than a quiescent current of the fourth transistor;

d) the respective inputs of the third and fourth transistors of the second differential amplifier stage being connected in an opposite sense to the signal source when compared with the respective inputs of the first and second transistors of the first differential amplifier stage;

e) an output of the circuit arrangement being between the respective outputs of the first and second differential amplifier stages; and f) an output circuit having two ohmic resistors, conductance values of the two resistors having a same ratio as a ratio of the quiescent currents of the transistors of the first and second differential amplifier stages, the two resistors being connected to the respective outputs of the first and second differential amplifier stages for generating a rectified a.c. voltage signal.

17. A circuit arrangement for rectification of an a.c. voltage signal generated by a signal source, the circuit arrangement including a first differential amplifier stage having at least a first transistor, a second transistor and an output, the first and second transistors each having an input, the a.c. voltage signal being coupled between the respective inputs of the first and second transistors, wherein the improvement comprises:

a) a second differential amplifier stage having a third transistor, a fourth transistor and an output, the third and fourth transistors each having an input;

b) the first and second differential amplifier stages each being supplied from a substantially constant current, the respective substantially constant currents supplying the first and second amplifier stages being identical;

c) the first and second transistors being identical transistors, a quiescent current of the first transistor being greater than a quiescent current of the second transistor, and the third and fourth transistors being identical transistors, and a quiescent current of the third transistor being greater than a quiescent current of the fourth transistor;

d) the respective inputs of the third and fourth transistors of the second differential amplifier stage being connected in an opposite sense to the signal source when compared with the respective inputs of the first and second transistors of the first differential amplifier stage;

e) an output of the circuit arrangement being between the respective outputs of the first and second differential amplifier stages; and f) an output circuit including a current balancing circuit, the current balancing circuit being connected to the respective outputs of the first and second differential amplifier stages for generating a rectified a.c. voltage signal.

18. A circuit arrangement in accordance with claim 17, wherein the current balancing circuit has a balancing factor corresponding to a ratio of the quiescent currents of the transistors of the first and second differential amplifier stages.

* * * * *